(12) United States Patent
Yender et al.

(10) Patent No.: US 12,379,442 B2
(45) Date of Patent: Aug. 5, 2025

(54) METHOD AND SYSTEM FOR CALIBRATING A CONTROLLER THAT DETERMINES A RESISTANCE OF A LOAD

(71) Applicant: WATLOW ELECTRIC MANUFACTURING COMPANY, St. Louis, MO (US)

(72) Inventors: Matthew Yender, Winona, MN (US); Stanton H. Breitlow, Winona, MN (US)

(73) Assignee: WATLOW ELECTRIC MANUFACTURING COMPANY, St. Louis, MO (US)

( * ) Notice: Subject to any disclaimer, the term of this patent is extended or adjusted under 35 U.S.C. 154(b) by 0 days.

(21) Appl. No.: 18/960,431

(22) Filed: Nov. 26, 2024

(65) Prior Publication Data
US 2025/0085376 A1    Mar. 13, 2025

Related U.S. Application Data

(63) Continuation of application No. PCT/US2023/067651, filed on May 31, 2023.

(60) Provisional application No. 63/347,702, filed on Jun. 1, 2022.

(51) Int. Cl.
*G01R 35/00*    (2006.01)
*G01R 27/08*    (2006.01)

(52) U.S. Cl.
CPC .......... *G01R 35/005* (2013.01); *G01R 27/08* (2013.01)

(58) Field of Classification Search
CPC ............................ G01R 27/08; G01R 35/005
See application file for complete search history.

(56) References Cited

U.S. PATENT DOCUMENTS

| | | | | |
|---|---|---|---|---|
| 11,673,348 B1* | 6/2023 | Viator | ................. | B65D 88/54 |
| | | | | 156/64 |
| 2013/0002207 A1* | 1/2013 | Wenger | ................. | H02J 7/34 |
| | | | | 320/152 |
| 2015/0338303 A1* | 11/2015 | Williams | ............ | G06F 3/04144 |
| | | | | 73/1.08 |

(Continued)

FOREIGN PATENT DOCUMENTS

| | | |
|---|---|---|
| KR | 1020010078404 A | 8/2001 |
| KR | 101729093 B1 | 4/2017 |
| KR | 1020200019237 A | 2/2020 |

(Continued)

OTHER PUBLICATIONS

International Search Report and Written Opinion issued in corresponding International Application No. PCT/US2023/067651, mailed Sep. 19, 2023.

*Primary Examiner* — Alesa Allgood
(74) *Attorney, Agent, or Firm* — Burris Law, PLLC

(57) ABSTRACT

A method for enhancing resistance measurements of a load includes obtaining a plurality of sample resistance values of the load, determining an average resistance value based on the plurality of sample resistance values, determining a resistance difference based on the average resistance value and a nominal resistance value associated with the load, updating an offset correction value of a controller in response to the resistance difference being greater than a resistance tolerance, and measuring a resistance of the load based on the offset correction value and one or more electrical characteristics of the load.

30 Claims, 6 Drawing Sheets

(56) References Cited

U.S. PATENT DOCUMENTS

2020/0365432 A1   11/2020   Wada et al.

FOREIGN PATENT DOCUMENTS

| KR | 1020210027234 A | 3/2021 |
|----|-----------------|--------|
| TW | 202138952 A | 10/2021 |
| WO | 2019173466 A1 | 9/2019 |

\* cited by examiner

METHOD AND SYSTEM FOR CALIBRATING A CONTROLLER THAT DETERMINES A RESISTANCE OF A LOAD

CROSS-REFERENCE TO RELATED APPLICATIONS

This application is a continuation of International Application No. PCT/US2023/067651, filed on May 31, 2023, which claims priority to and the benefit of U.S. Provisional Patent Application No. 63/347,702, filed on Jun. 1, 2022. The disclosures of the above applications are incorporated herein by reference in their entireties.

FIELD

The present disclosure relates to calibrating a controller that determines a resistance of a load.

BACKGROUND

The statements in this section merely provide background information related to the present disclosure and may not constitute prior art.

A controller may control one or more performance characteristics of a load based on feedback and/or sensor data associated with the load, such as voltage data, current data, resistance data, temperature data, among other types of feedback/sensor data. As an example, a system may include a heater having one or more resistive heating elements and a controller for controlling power to the heater to generate heat at a temperature setpoint. As a more specific example, a semiconductor process system includes a pedestal heater that includes a ceramic substrate and one or more resistive heating elements that define one or more heating zones within the ceramic substrate, and a controller may be configured to independently control the performance characteristics of the one or more heating zones.

In some applications, the heater can be a "two-wire" heater in which the resistive heating elements function as heaters and as temperature sensors with two leads wires operatively connected to the heating element rather than four. A controller configured to control the heater can determine the temperature of the resistive heating elements based on the resistance of the resistive heating element(s). Specifically, the controller calculates resistance based on voltage and/or current measurements and determines the temperature of the resistive heating element based on the calculated resistance. Typically, voltage and current measurements are calibrated to accurately determine resistance at various temperature setpoints, and resistance-to-temperature correlation data is used to determine the temperature based on calculated resistance. However, over certain power or temperature ranges, it can be difficult to obtain accurate resistance measurements and corresponding temperature measurements due to offset errors or gain errors of a controller.

These challenges with obtaining accurate temperature measurements are addressed by the present disclosure.

SUMMARY

This section provides a general summary of the disclosure and is not a comprehensive disclosure of its full scope or all of its features.

A method for enhancing resistance measurements of a load includes obtaining a plurality of sample resistance values of the load, determining an average resistance value based on the plurality of sample resistance values, determining a resistance difference based on the average resistance value and a nominal resistance value associated with the load, updating an offset correction value of a controller in response to the resistance difference being greater than a resistance tolerance, and measuring a resistance of the load based on the offset correction value and one or more electrical characteristics of the load.

In variations of this method, which may be implemented individually or in any combination: the offset correction value is a voltage offset correction value, a current offset correction value, or a combination thereof; the method includes obtaining a plurality of current values of the load, determining an average current value based on the plurality of current values, and determining the offset correction value based on the average current value and the resistance difference, where the offset correction value is the voltage offset correction value; the offset correction value is further based on a product of the average current value and the resistance difference; the method includes obtaining a plurality of voltage values and a plurality of current values of the load, determining an average voltage value based on the plurality of voltage values and an average current value based on the plurality of current values, determining a nominal current value based on the average voltage value and the nominal resistance value, and determining the offset correction value based on the nominal current value and the average current value, where the offset correction value is the current offset correction value; the nominal current value is further based on a quotient of the average voltage value and the nominal resistance value; the offset correction value is further based on a difference between the nominal current value and the average current value; the method includes providing a calibration signal to the load, where the plurality of sample resistance values of the load are obtained in response to providing the calibration signal to the load; the calibration signal has a predetermined voltage value range defined by a first voltage value and a second voltage value, the first voltage value is less than the second voltage value, and the first voltage value and the second voltage value are greater than zero volts.; the plurality of sample resistance values of the load are obtained when the calibration signal has the first voltage value; and the plurality of sample resistance values of the load are obtained in response to a timer value associated with a timer of the controller being greater than a threshold timer value.

The present disclosure also provides a system for enhancing resistance measurements of a load. The system includes one or more processors and one or more nontransitory computer-readable mediums comprising instructions that are executable by the one or more processors. The instructions include providing a calibration signal to the load, obtaining a plurality of sample resistance values of the load, determining an average resistance value based on the plurality of sample resistance values, determining a resistance difference based on the average resistance value and a nominal resistance value associated with the load, updating an offset correction value of a controller in response to the resistance difference being greater than a resistance tolerance, and measuring a resistance of the load based on the offset correction value and one or more electrical characteristics of the load.

In variations of this system, which may be implemented individually or in any combination: the load is a heater comprising a resistive element; the instructions include obtaining a plurality of current values of the load, determining an average current value based on the plurality of current values, and determining the offset correction value based on a product of the average current value and the resistance difference; the instructions include obtaining a plurality of voltage values and a plurality of current values of the load, determining an average voltage value based on the plurality of voltage values and an average current value based on the plurality of current values, determining a nominal current value based on a quotient of the average voltage value and the nominal resistance value, and determining the offset correction value based on a difference between the nominal current value and the average current value.

In yet another form, the present disclosure provides a method for enhancing resistance measurements of a load. The method includes providing a calibration signal to the load, where the calibration signal has a predetermined voltage value range defined by a first voltage value and a second voltage value and determining a calibration mode of a controller based on the calibration signal, where the calibration mode is one of an offset calibration mode and a gain calibration mode. The method includes, in response to determining the calibration mode is the offset calibration mode: obtaining a plurality of sample resistance values of the load, determining an average resistance value based on the plurality of sample resistance values, determining a resistance difference based on the average resistance value and a nominal resistance value associated with the load, updating an offset correction value of a controller in response to the resistance difference being greater than a resistance tolerance, and measuring a resistance of the load based on the offset correction value and one or more electrical characteristics of the load.

In variations of this method, which may be implemented individually or in any combination: the calibration mode is the gain calibration mode when the calibration signal has the second voltage value, the second voltage value is greater than the first voltage value, and the first voltage value and the second voltage value are greater than zero volts; the calibration mode is the offset calibration mode when the calibration signal has the first voltage value, the second voltage value is greater than the first voltage value, and the first voltage value and the second voltage value are greater than zero volts; the calibration mode is the offset calibration mode in response to a timer value associated with a timer of the controller being greater than a threshold timer value; the offset correction value is a voltage offset correction value, a current offset correction value, or a combination thereof; the method includes obtaining, in response to determining the calibration mode is the offset calibration mode, a plurality of current values of the load, determining, in response to determining the calibration mode is the offset calibration mode, an average current value based on the plurality of current values, and determining, in response to determining the calibration mode is the offset calibration mode, the offset correction value based on the average current value and the resistance difference, where the offset correction value is the voltage offset correction value; the offset correction value is further based on a product of the average current value and the resistance difference; the method includes obtaining, in response to determining the calibration mode is the offset calibration mode a plurality of voltage values and a plurality of current values of the load, determining, in response to determining the calibration mode is the offset calibration mode, an average voltage value based on the plurality of voltage values and an average current value based on the plurality of current values, determining, in response to determining the calibration mode is the offset calibration mode, a nominal current value based on the average voltage value and the nominal resistance value, and determining, in response to determining the calibration mode is the offset calibration mode, the offset correction value based on the nominal current value and the average current value, where the offset correction value is the current offset correction value; the nominal current value is further based on a quotient of the average voltage value and the nominal resistance value; and the offset correction value is further based on a difference between the nominal current value and the average current value.

In still another form, the present disclosure provides a system for enhancing resistance measurements of a load. The system includes one or more processors and one or more nontransitory computer-readable mediums comprising instructions that are executable by the one or more processors. The instructions include providing a calibration signal to the load, where the calibration signal has a predetermined voltage value range defined by a first voltage value and a second voltage value, and where the second voltage value is greater than the first voltage value, and determining a calibration mode of a controller based on the calibration signal, where the calibration mode is an offset calibration mode when the calibration signal has the first voltage value, and where the calibration mode is a gain calibration mode when the calibration signal has the second voltage value. The instructions include, in response to determining the calibration mode is the offset calibration mode: obtaining a plurality of sample resistance values of the load, determining an average resistance value based on the plurality of sample resistance values, determining a resistance difference based on the average resistance value and a nominal resistance value associated with the load, updating an offset correction value of a controller in response to the resistance difference being greater than a resistance tolerance, and measuring a resistance of the load based on the offset correction value and one or more electrical characteristics of the load.

In variations of this system, which may be implemented individually or in any combination: the calibration mode is the offset calibration mode in response to a timer value associated with a timer of the controller being greater than a threshold timer value; the instructions include obtaining, in response to determining the calibration mode is the offset calibration mode, a plurality of current values of the load, determining, in response to determining the calibration mode is the offset calibration mode, an average current value based on the plurality of current values, and determining, in response to determining the calibration mode is the offset calibration mode, the offset correction value based on a product of the average current value and the resistance difference; the instructions include obtaining, in response to determining the calibration mode is the offset calibration mode a plurality of voltage values and a plurality of current values of the load, determining, in response to determining the calibration mode is the offset calibration mode, an average voltage value based on the plurality of voltage values and an average current value based on the plurality of current values, determining, in response to determining the calibration mode is the offset calibration mode, a nominal current value based on a quotient of the average voltage value and the nominal resistance value, and determining, in response to determining the calibration mode is the offset calibration mode, the offset correction value based on a difference between the nominal current value and the average current value; and the load is a heater comprising a resistive element.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
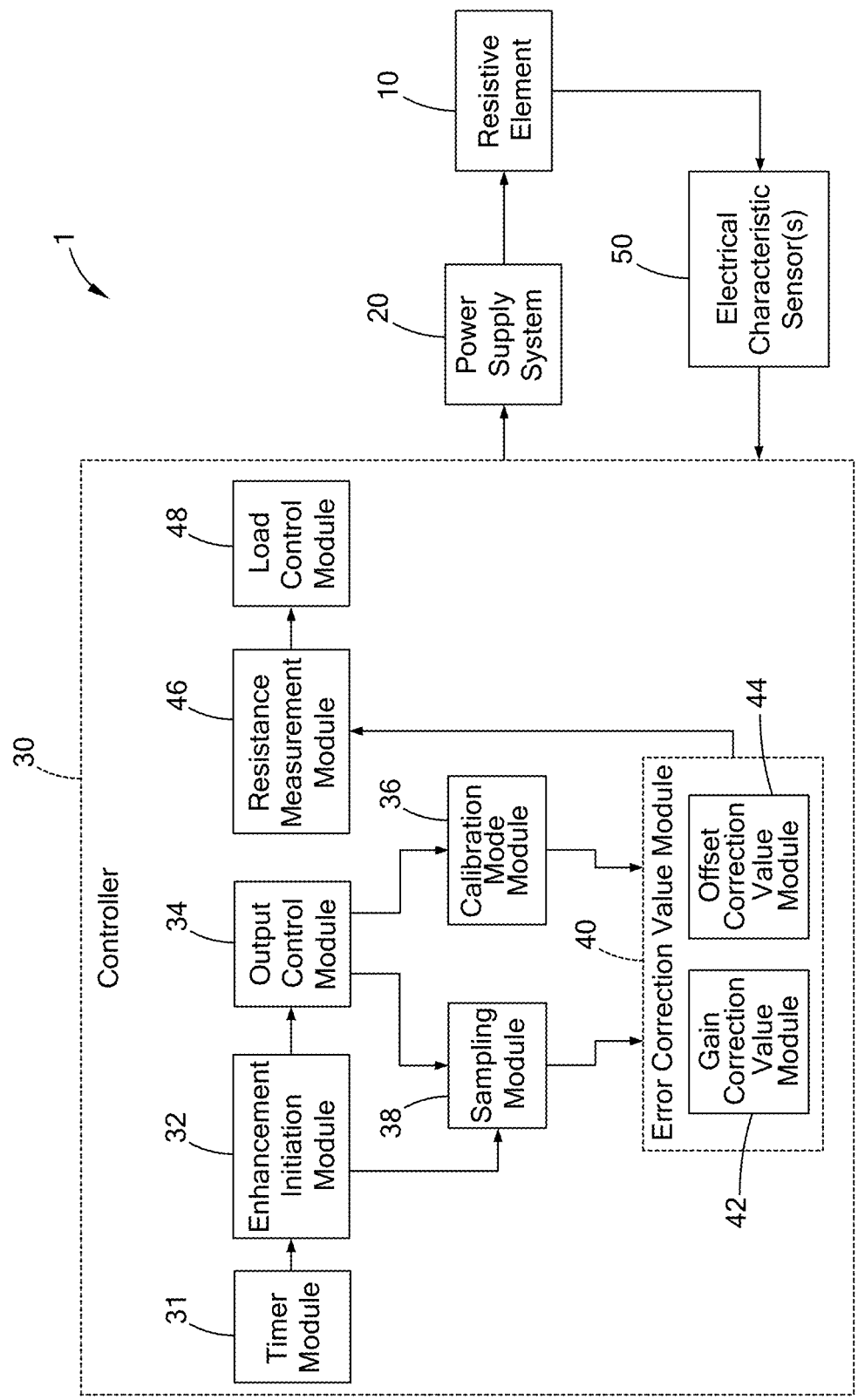
FIG. 1 is a block diagram of a system in accordance with the teachings of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

A load, such as an electric heater, may not be supplied with a full range of power (i.e., voltage and/or current) from a power supply system during operation. As an example, more power is generally employed during ramp-up or during a setpoint change rather than maintaining the electric heater at a desired steady-state temperature. Thus, the electric heater primarily operates in the lower end of a power spectrum throughout its operation.

However, at lower ends of the power spectrum, the accuracy of resistances measured by a controller decreases as a result of thermoelectric voltages (thermoelectric EMFs), radio frequency interference, electromagnetic interference, internal resistances of a power supply of the power supply system, and analog to digital converter circuit (ADC) errors of the controller, among other causes that inhibit the accuracy of resistance measurements. As a specific example, the ADC of the controller may have offset errors that inhibit the accuracy of resistance measurements and, more specifically, the accuracy for resistance-based control and/or operations of the load, such as determining a temperature of the load or performing a corrective action based on the resistance/temperature. As used herein, "offset error" refers to a difference between an actual voltage (or current) value deviation when the digital output of the ADC increments from 0 to 1 and an expected voltage (or current) deviation when the digital output of the ADC increments from 0 to 1. As an example, if the actual voltage deviation when the digital output of the ADC increments from 0 to 1 is 7.5 mV, and if the expected voltage deviation when the digital output of the ADC increments from 0 to 1 is 2.5 mV, the offset correction value is 5.0 mV.

As described herein in further detail, the controller is configured to enhance the resistance measurements by defining one or more offset correction values to accommodate the offset error of the controller during a resistance enhancement routine, thereby improving the accuracy of resistance measurements obtained at lower ends of the power spectrum. As used herein, "enhancing the resistance measurements" refers to improving the accuracy of resistance measurements obtained by the controller, and a "resistance enhancement routine" refers to a routine for improving the accuracy of resistance measurements obtained by the controller.

Referring to FIG. 1, a system 1 is shown and generally includes a load 10, a power supply system 20, a controller 30, and one or more electrical characteristic sensors 50. In one form, the load 10 is any device and/or system that includes a resistive element. In one form, the load 10 is provided by a heater that includes at least one resistive heating element. As an example, the heater (as the load 10) may be a layered heater, a cartridge heater, a tubular heater, a polymer heater, a flexible heater, among other heater constructions, having the resistive element(s). As another example, the load 10 is a "two-wire" heater in which the resistive heating element(s) function as heater(s) and as temperature sensor(s) with two lead wires operatively connected to the resistive heating element(s) rather than four (two for the heater and two for a discrete sensor). Such two-wire capability is disclosed in, for example, U.S. Pat. No. 7,196,295, which is commonly assigned with the present application and incorporated herein by reference in its entirety. Typically, in a two-wire system, the resistive heating elements comprise a material that exhibits a varying resistance with varying temperature such that an average temperature of the resistive heating element is determined based on a change in resistance of the resistive heating element. In one form, the resistance of the resistive heating element is calculated by first measuring the voltage across and the current through the heating elements and then, using Ohm's law, the resistance is determined.

In one form, the load 10 is a multizone pedestal heater that includes a heating plate and a support shaft disposed at a bottom surface of the heating plate. The heating plate includes a substrate and a plurality of resistive heating elements embedded in or disposed along a surface of the substrate. The resistive heating elements in one form are independently controlled by the controller 30 and define a plurality of heating zones. Example multizone heaters are disclosed in Applicant's co-pending applications, U.S. Ser. No. 63/250,655, filed Sep. 30, 2021, and titled "METHOD AND SYSTEM FOR CALCULATING ELECTRICAL CHARACTERISTICS OF AN ELECTRIC HEATER," and U.S. Ser. No. 16/196,699, filed Nov. 20, 2018, and titled "MULTI-ZONE PEDESTAL HEATER HAVING A ROUTING LAYER," which are commonly owned with the present application and the contents of which are incorporated herein by reference in its entirety.

In one form, the load 10 is provided by a device having a fixed resistance and a low temperature coefficient of resistance (TCR) (i.e., the load 10 has a TCR that inhibits nominal resistance shifts at a given voltage value). In one form, the load 10 is provided by a sensor including a resistive element that has a resistance that changes based on a temperature. As an example, the load 10 is a resistance temperature detector (RTD), a thermocouple, or other sensors that include resistive elements having resistances that are dependent on temperature (and vice versa). While examples of the load 10 are provided above, it should be understood that the load 10 may be provided by any device having a resistive element and is not limited to the examples described herein.

In one form, the power supply system 20 supplies electrical power to the load 10 based on a command received from the controller 30. In one form, the power supply system 20 may be electrically coupled to a power source (e.g., a direct current (DC) or alternating current (AC) power source), and include one or more power converter circuits (e.g., a buck converter, an inverter, a rectifier, among other power converter circuits) to output adjustable power to the load 10. In some forms, the power supply system 20 may further include one or more processors and memory for storing computer readable instructions executed by the processors for controlling the duration, magnitude, and electrical characteristics of the electrical power and/or various performance characteristics of the load 10 based on the command received, which may be a desired power output to be provided to the load 10. In another example, the power converter system of the power supply system 20 may include a power switch that is operable by the controller 30 to control the power provided by the power supply system. It should be readily understood that the power supply system 20 may be configured in various suitable ways to generate the adjustable power output and should not be limited to the examples provided herein.

In one form, the one or more electrical characteristic sensors 50 are configured to sense electrical characteristics of the load 10. As an example, the one or more electrical characteristic sensors 50 may include an ammeter, a voltmeter, or a combination thereof (e.g., a power metering chip that simultaneously measures current and voltage regardless of the power being applied to the load 10) to sense resistance, voltage, and/or current. It should be understood that the one or more electrical characteristic sensors 50 may be provided by any types of sensors configured to sense resistance, voltage, and/or current and is not limited to the examples described herein.

In one form, the controller 30 includes a timer module 31, an enhancement initiation module 32, an output control module 34, a calibration mode module 36, a sampling module 38, an error correction value module 40, a resistance measurement module 46, and a load control module 48. To perform the functionality described herein, the controller 30 may include one or more processors configured to execute instructions stored in a nontransitory computer-readable medium, such as a random access memory or a read-only memory.

In one form, the enhancement initiation module 32 selectively initiates the resistance enhancement routine based on a timer value associated with the timer module 31, which is configured to increment the timer value as a function of elapsed time. As an example, when the timer value is greater than a threshold timer value (e.g., four minutes), the enhancement initiation module 32 initiates the resistance enhancement routine. In one form, the threshold timer value corresponds to a value in which the resistance value of the resistive element 12 stabilizes or settles proximate to an expected resistance value associated with a signal provided to the load via the power supply system 20.

In one form, the output control module 34 controls the power supply system 20 to provide a signal having various electrical characteristics (e.g., voltage, current, power, among others) to the load 10. As an example, the output control module 34 controls the power supply system 20 to provide a calibration signal to the load 10. In some forms, the calibration signal may have a predetermined voltage value range defined by a first voltage value (e.g., 4 V) and a second voltage value (e.g., 104 V) that is greater than the first voltage value. In some forms, each of the first voltage value and the second voltage value is greater than zero volts. As described below in further detail, the error correction value module 40 determines a calibration mode of the controller 30 based on the voltage value of the calibration signal and selectively updates an offset correction value of the controller 30 based on the determined calibration mode.

In one form, the calibration mode module 36 determines a calibration mode of the controller 30 based on the voltage value of the calibration signal. As an example, when the calibration signal has the first voltage value (e.g., the lower voltage of the two voltage values of the predetermined voltage value range), the calibration mode module 36 determines that the calibration mode is an offset calibration mode. As another example, when the calibration signal has the second voltage value, the calibration mode module 36 determines that the calibration mode is a gain calibration mode.

When the controller 30 is operating in the gain calibration mode, the calibration mode module 36 instructs a gain correction module 42 of the error correction value module 40 to selectively update a gain correction value of the controller 30. Selectively updating a gain correction value of the controller 30 is disclosed in Applicant's co-pending application, U.S. Ser. No. 63/250,655, filed Sep. 30, 2021, and titled "METHOD AND SYSTEM FOR CALCULATING ELECTRICAL CHARACTERISTICS OF AN ELECTRIC HEATER," which is commonly owned with the present application and the contents of which are incorporated herein by reference in its entirety. Specifically, the gain correction module 42 reads voltage counts and current counts (i.e., V-I counts) and determines a resistance of the load 10 based on the V-I counts, which are integer representations of a millivolt (mV) input signal level and are typically 12, 16, or 24-bit values. As such, the gain correction module 42 determines the resistance based on a ratio of V-I counts and adjusts the fixed gain correction value of the controller 30 and dynamic gain correction value based on the ratio of V-I counts and/or at least one of the voltage counts and current counts.

When the controller 30 is operating in the offset calibration mode, the calibration mode module 36 instructs an offset correction module 44 of the error correction value module 40 to selectively update an offset correction value of the controller 30. Additional details regarding the selective updating of the offset correction value are provided below. As described herein, "offset correction value" refers to a voltage value or a current value that offsets or nullifies the offset error of the controller 30 for the given voltage value of the calibration signal.

In one form, the sampling module 38 obtains a plurality of sample resistance values, current values (e.g., peak current values or RMS current values), and/or voltage values (e.g., peak voltage values or RMS voltage values) (collectively referred to hereinafter as "the values") when the calibration signal is provided to the load 10. In one form, the sampling module 38 obtains the values when the calibration signal is provided to the load and has the first voltage value.

To perform the functionality described herein, the sampling module 38 may include an ADC that is configured to convert analog signals sensed by the one or more electrical characteristic sensors 50 representing the values into a digital value for processing and interpretation by the controller 30. As an example, the ADC is a 24-bit device that outputs digital values from 0-16,777,215 representing the sensed electrical characteristics. It should be understood that the ADC may have various bit configurations in other forms and is not limited to the examples described herein.

In one form and when the controller 30 is operating in the offset calibration mode, the offset correction module 44 determines an average resistance value based on the plurality of sample resistance values. In one form, the offset correction module 44 determines an average current value based on the plurality of current values along with the average resistance value. In one form, the offset correction module 44 determines an average voltage value based on the plurality of voltage values along with the average resistance value and the average current value.

Furthermore, the offset correction module 44 determines a resistance difference based on the average resistance value and a nominal resistance value associated with the load 10. As used herein, "nominal resistance value associated with the load 10" refers to an expected or predicted resistance value of the load 10 and may be defined by, for example, a manufacturer of the load 10. As a specific example and as shown in relation (1), the sampling module 38 determines a resistance difference ($R_d$) based on an absolute value of the difference between the nominal resistance value ($R_{nom}$) and the average resistance value ($R_{ave}$):

$$R_d = R_{nom} - R_{ave} \qquad (1)$$

In one form, the offset correction module 44 selectively updates the offset correction value of the controller 30 based on the resistance difference and a resistance tolerance. As used herein, "resistance tolerance" refers to a predetermined resistance value in which an offset correction value is updated. In one form, the resistance tolerance is a resistance value that corresponds to a given temperature difference indicated by a predetermined resistance-temperature curve of the load 10 (e.g., the resistance tolerance is 5 milliohms as a result of a resistance-temperature curve of the load 10 indicating that a 5-milliohm increase/decrease correlates to 0.5° C. increases/decreases). As an example, the offset correction module 44 updates the offset correction value of the controller 30 in response to the resistance difference being greater than the resistance tolerance. As another example, the offset correction module 44 refrains from updating the offset correction value of the controller 30 in response to the resistance difference being less than the resistance tolerance (i.e., the controller 30 is calibrated).

In one form, the offset correction module 44 updates the offset correction value of the controller 30 based on a voltage offset correction value and/or a current offset correction value. As an example, the offset correction module 44 determines the voltage offset correction value ($V_{offset}$) based on an average current value associated with the plurality of current values obtained by the sampling module 38 ($I_{ave}$) and the resistance difference ($R_d$). In one form, the voltage offset correction value ($V_{offset}$) corresponds to a voltage offset that corrects resistance measurement errors of the load 10 at the first voltage value of the calibrated signal. As an example and as shown in relation (2), the voltage offset correction value ($V_{offset}$) is based on a product of the average current value ($I_{ave}$) and the resistance difference ($R_d$):

$$V_{offset} = I_{ave} * R_d \qquad (2)$$

In one form, the offset correction module 44 determines the current offset correction value ($I_{offset}$) based on a nominal current value ($I_{nom}$) and an average current value associated with the plurality of current values obtained by the sampling module 38 ($I_{ave}$). In one form, the nominal current value ($I_{nom}$) is based on an average current value associated with the plurality of voltage values obtained by the sampling module ($V_{ave}$) and the nominal resistance value ($R_{nom}$). As a specific example and as shown in relation (3), the nominal current value is based on a quotient of the average voltage value ($V_{ave}$) and the nominal resistance value ($R_{nom}$):

$$I_{nom} = \frac{V_{ave}}{R_{nom}} \qquad (3)$$

In another form, the current offset correction value ($I_{offset}$) corresponds to a current offset that corrects resistance measurement errors of the load 10 at the first voltage value of the calibrated signal. As below in relation (4), the offset correction module 44 determines the current offset correction value ($I_{offset}$) based on a difference between the nominal current value ($I_{nom}$) and the average current value ($I_{ave}$):

$$I_{offset} = I_{nom} - I_{ave} \qquad (4)$$

In one form, the resistance measurement module 46 is configured to determine a resistance of the load 10 based on one or more electrical characteristics of the load and the offset correction value (i.e., at least one of the voltage offset correction value and the current offset correction value). As an example, the resistance measurement module 46 obtains a measured voltage value of the load 10 (as the one or more electrical characteristics) and adjusts the measured voltage value by the voltage offset correction value. As such, the accuracy of the resistance measurements obtained by the resistance measurement module 46 is improved for resistance measurements obtained at lower ends of the power spectrum.

In another form, the load control module 48 controls the operation of the load 10 based on the determined resistance. As an example, the load control module 48 may selectively control the amount of power applied to the load based on the resistance (e.g., ramp-up power, ramp-down power, turn-off power, among others), determine a temperature of the load 10 based on the resistance, and/or notify an operator of the resistance and/or temperature of the load 10 using, for example, a computing device including a display.

Figure 2:
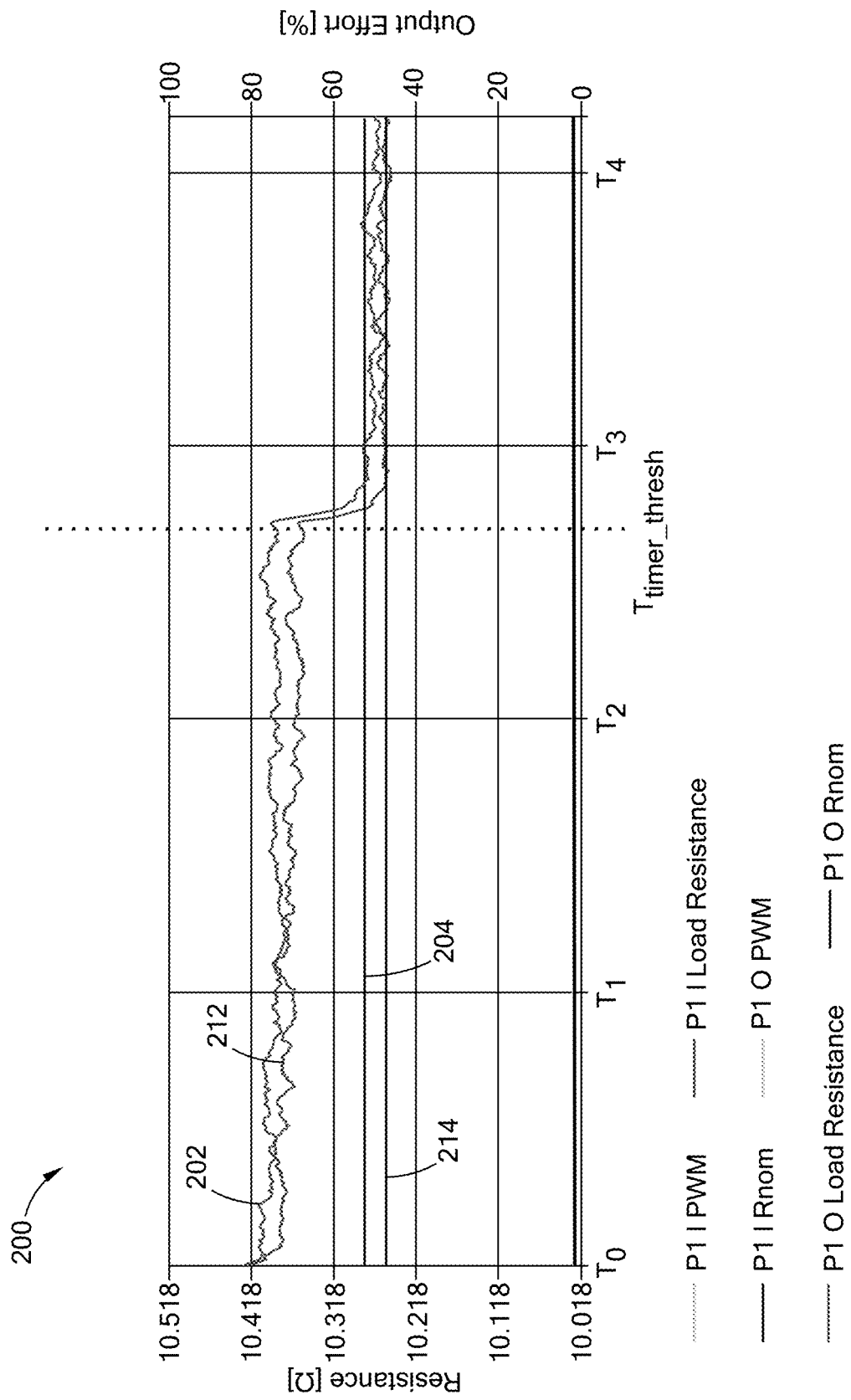
FIG. 2 is a graph illustrating a resistance of the load prior to and after applying an offset correction value in accordance with the teachings of the present disclosure.

In an example application and referring to FIG. 2, a graph 200 illustrating the resistance enhancement routine during an offset calibration mode is shown and includes plots 202, 212 representing the measured resistance of two different loads (as indicated by measured voltages/currents of the loads) and plots 204, 214 representing the nominal resistances of the loads. Prior to the threshold timer value of the timer module 31 (i.e., between times $T_0$ and $T_{timer\_thresh}$), the output control module 34 provides the calibration signal to the load 10, and the measured resistances (as indicated by the plots 202, 212) deviate from the nominal resistance of the loads (as indicated by plots 204, 214) based on the offset error of the controller 30. At (or after) the threshold timer value elapses (i.e., at time $T_{timer\_thresh}$, where the resistance of the loads are stabilized), the enhancement initiation module 32 initiates the enhancement routine performed by the sampling module 38 and the error correction value module 40 by determining the offset correction value. Specifically, the error correction value module 40 determines and applies the offset correction value to the measured voltages and/or currents to enhance the accuracy of the resistance measurements, as indicated by the convergence of the plots 202, 204 and the convergence of the plots 212, 214 after the threshold timer value.

Figure 3:
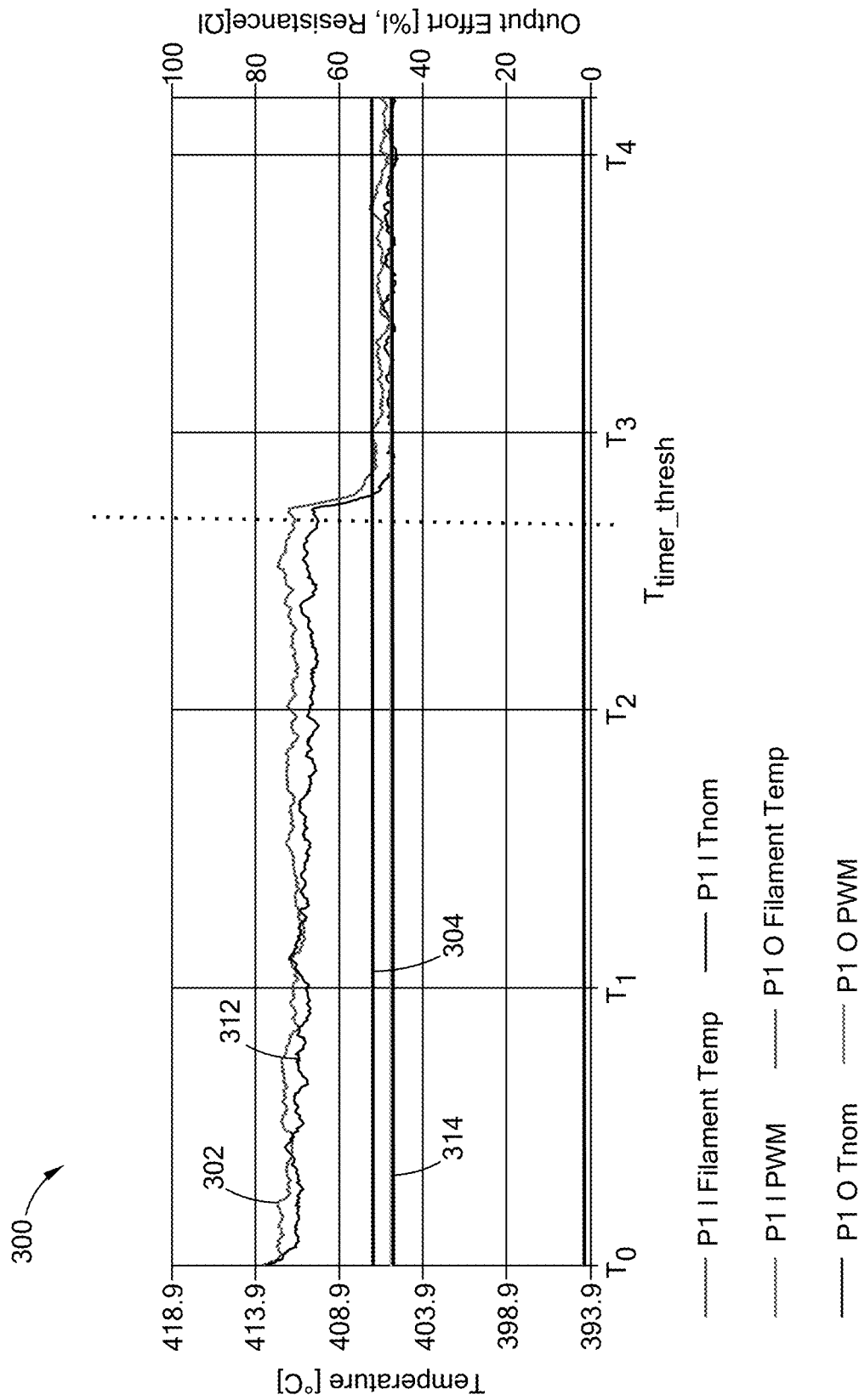
FIG. 3 is a graph illustrating a temperature of the load prior to and after applying an offset correction value in accordance with the teachings of the present disclosure.

In another example application and referring to FIG. 3, a graph 300 illustrating the resistance enhancement routine during an offset calibration mode is shown and includes plots 302, 312 representing the measured temperature of two different loads (as indicated by measured resistances of the loads) and plots 304, 314 representing the nominal temperatures of the loads for a given nominal resistance. Prior to the threshold timer value of the timer module 31 (i.e., between times $T_0$ and $T_{timer\_thresh}$), the output control module 34 provides the calibration signal to the load 10, and the measured temperatures (as indicated by the plots 302, 312) deviate from the nominal temperature of the loads (as indicated by plots 304, 314) based on the offset error of the controller 30. At (or after) the threshold timer value elapses (i.e., at time $T_{timer\_thresh}$, where the resistance of the loads are stabilized), the enhancement initiation module 32 initiates the enhancement routine performed by the sampling module 38 and the error correction value module 40 by determining the offset correction value. Specifically, the error correction value module 40 determines and applies the offset correction value to the measured voltages and/or currents to enhance the accuracy of the resistance/temperature measurements, as indicated by the convergence of the plots 302, 304 and the convergence of the plots 312, 314 after the threshold timer value.

Figure 4:
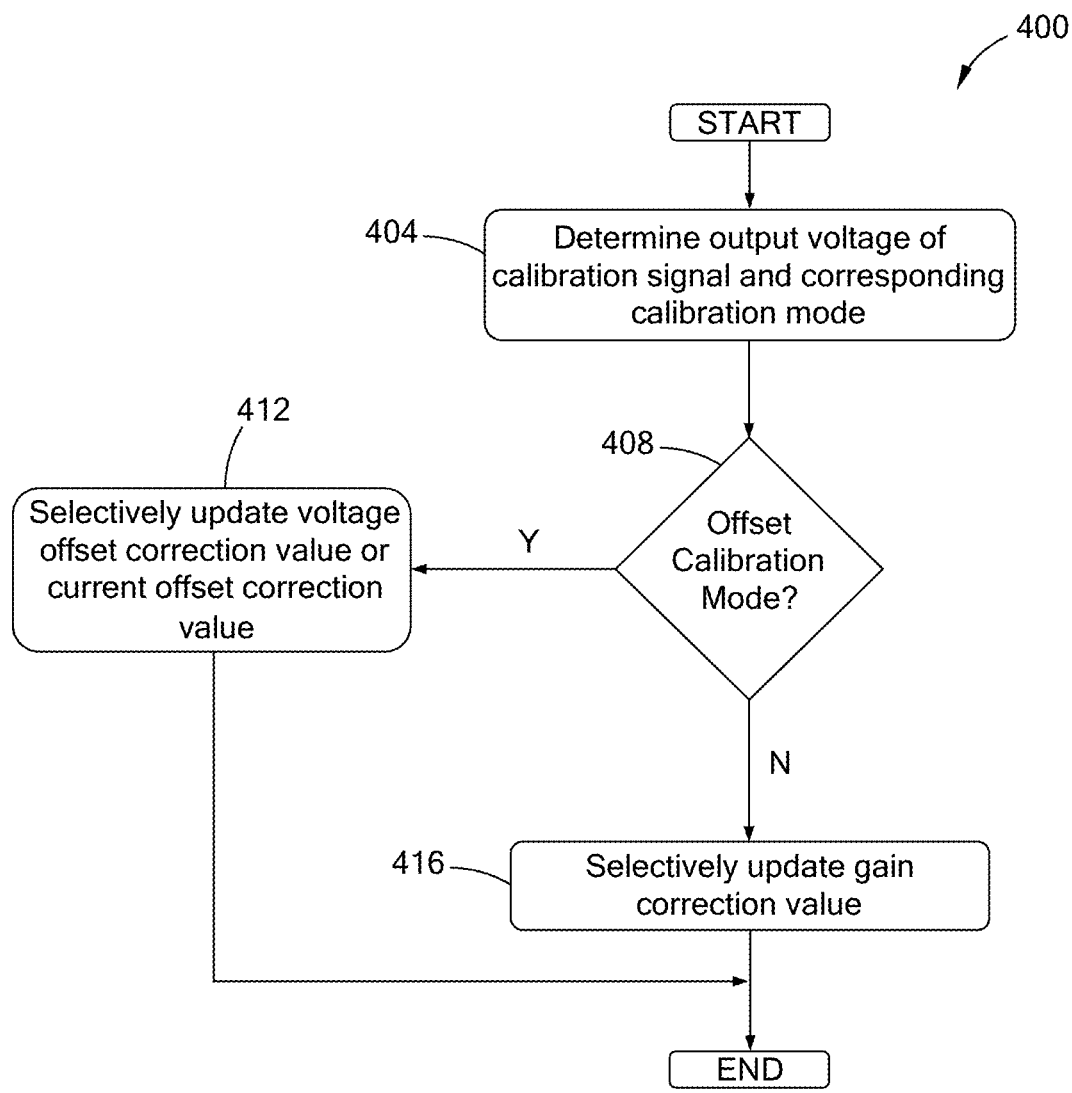
FIG. 4 is a flowchart of an example calibration mode selection routine in accordance with the teachings of the present disclosure.

Referring to FIG. 4, a flowchart illustrating a calibration mode selection routine 400 is shown. At 404, the controller 30 determines an output voltage of the calibration signal and a corresponding calibration mode. As an example, when the calibration signal has the first voltage value (e.g., the lower voltage of the two voltage values of the predetermined voltage value range), the controller 30 determines that the calibration mode is an offset calibration mode. As another example, when the calibration signal has the second voltage value, the controller 30 determines that the calibration mode is a gain calibration mode. At 408, the controller 30 determines whether the calibration mode is the offset calibration mode. If the calibration mode is the offset calibration mode, the calibration mode selection routine 400 proceeds to 412, where the controller 30 selectively updates at least one of the voltage offset correction value and the current offset correction value. If the calibration mode is not the offset calibration mode (i.e., the gain calibration mode), the calibration mode selection routine 400 proceeds to 416, where the controller 30 selectively updates the gain correction value.

Figure 5:
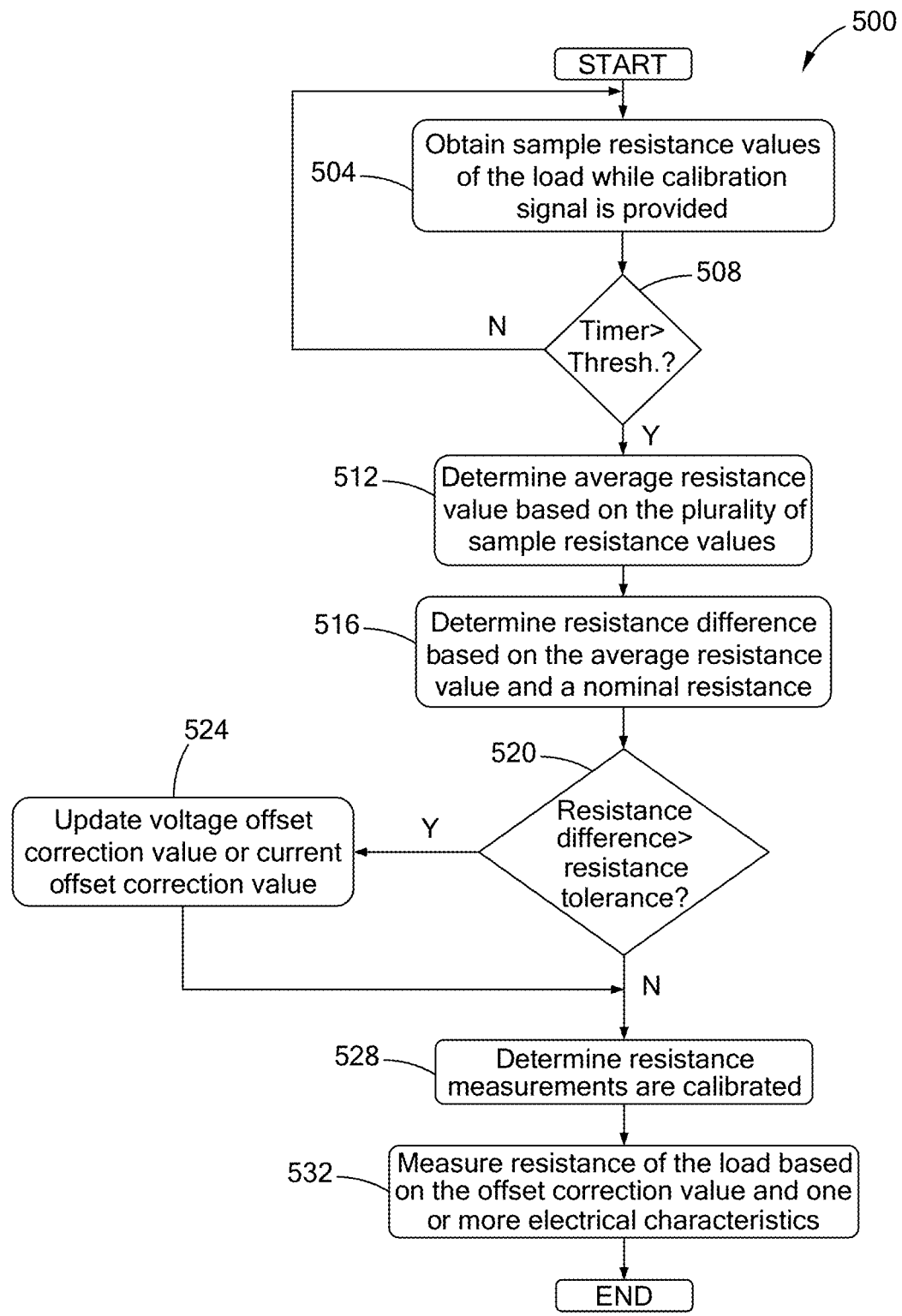
FIG. 5 is a flowchart of an example routine for enhancing resistance measurements of the controller in an offset calibration mode in accordance with the teachings of the present disclosure.

Referring to FIG. 5, a flowchart illustrating a routine 500 for enhancing resistance measurements of the controller in an offset calibration mode is shown. At 504, the controller 30 obtains sample resistance values of the load 10 while the calibration signal is provided to the load 10. At 508, the controller 30 determines whether the timer value is greater than a threshold timer value. If so, the routine 500 proceeds to 512; if the timer value is less than the threshold timer value, the routine 500 proceeds to 504. At 512, the controller 30 determines an average resistance value based on the plurality of sample resistance values and determines a resistance difference based on the average resistance and the nominal resistance at 516.

At 520, the controller 30 determines whether the resistance difference is greater than the resistance tolerance. If so, the routine proceeds to 524, where the controller 30 updates the voltage offset correction value and/or the current offset correction value and then proceeds to 528. An example routine for determining and updating the voltage offset correction value is described below in further detail with reference to FIG. 6, and an example routine for determining and updating the current offset correction value is described below in further detail with reference to FIG. 7. If the resistance difference is less than the resistance tolerance at 524, the routine 500 proceeds to 528, where the controller 30 determines the resistance measurements are calibrated. At 532, the controller 30 measures the resistance of the load 10 based on the offset correction value and one or more electrical characteristics obtained from the one or more electrical characteristic sensors 50.

Figure 6:
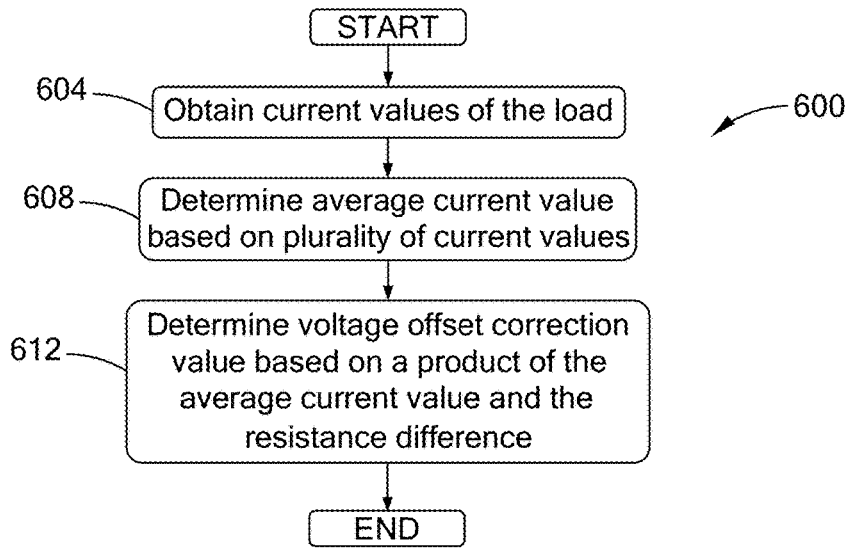
FIG. 6 is a flowchart of an example routine for determining a voltage offset correction value in accordance with the teachings of the present disclosure.

Referring to FIG. 6, a flowchart illustrating a routine 600 for determining and updating the voltage offset correction value is shown. At 604, the controller 30 obtains a plurality of current values of the load 10 and determines an average current value based on the plurality of current values at 608. At 612, the controller 30 determines the voltage offset correction value based on a product of the average current value and the resistance difference.

Figure 7:
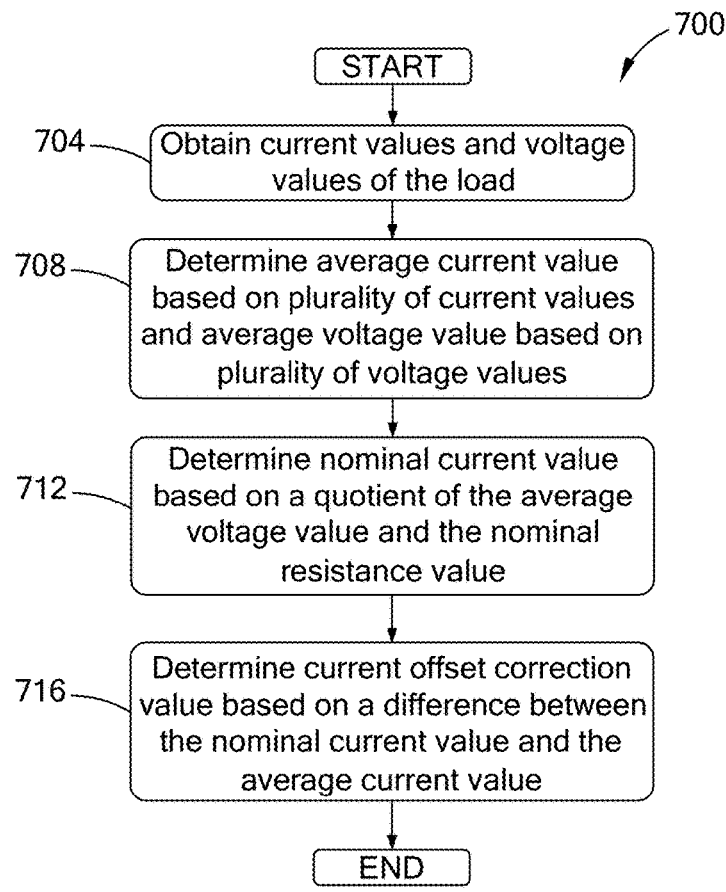
FIG. 7 is a flowchart of an example routine for determining a current offset correction value in accordance with the teachings of the present disclosure.

Referring to FIG. 7, a flowchart illustrating a routine 700 for determining and updating the current offset correction value is shown. At 704, the controller 30 obtains a plurality of current values and voltage values of the load 10 and determines an average current value and average voltage value at 708. At 712, the controller 30 determines the nominal current value based on a quotient of the average voltage value and the nominal resistance value. At 716, the controller 30 determines a current offset correction value based on a difference between the nominal current value and the average current value.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

In this application, the term "controller" may be replaced with the term "circuit". The term "controller" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The term code may include software, firmware, and/or microcode, and may refer to programs, routines, functions, classes, data structures, and/or objects. The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A method for enhancing resistance measurements of a load, the method comprising:
   obtaining a plurality of sample resistance values of the load;
   determining an average resistance value based on the plurality of sample resistance values;
   determining a resistance difference based on the average resistance value and a nominal resistance value associated with the load;
   updating an offset correction value of a controller in response to the resistance difference being greater than a resistance tolerance; and
   measuring a resistance of the load based on the offset correction value and one or more electrical characteristics of the load.

2. The method of claim 1, wherein the offset correction value is a voltage offset correction value, a current offset correction value, or a combination thereof.

3. The method of claim 2 further comprising:
   obtaining a plurality of current values of the load;
   determining an average current value based on the plurality of current values; and
   determining the offset correction value based on the average current value and the resistance difference, wherein the offset correction value is the voltage offset correction value.

4. The method of claim 3, wherein the offset correction value is further based on a product of the average current value and the resistance difference.

5. The method of claim 2 further comprising:
   obtaining a plurality of voltage values and a plurality of current values of the load;
   determining an average voltage value based on the plurality of voltage values and an average current value based on the plurality of current values;
   determining a nominal current value based on the average voltage value and the nominal resistance value; and
   determining the offset correction value based on the nominal current value and the average current value, wherein the offset correction value is the current offset correction value.

6. The method of claim 5, wherein the nominal current value is further based on a quotient of the average voltage value and the nominal resistance value.

7. The method of claim 5, wherein the offset correction value is further based on a difference between the nominal current value and the average current value.

8. The method of claim 1 further comprising providing a calibration signal to the load, wherein the plurality of sample resistance values of the load are obtained in response to providing the calibration signal to the load.

9. The method of claim 8, wherein:
   the calibration signal has a predetermined voltage value range defined by a first voltage value and a second voltage value;
   the first voltage value is less than the second voltage value; and
   the first voltage value and the second voltage value are greater than zero volts.

10. The method of claim 9, wherein the plurality of sample resistance values of the load are obtained when the calibration signal has the first voltage value.

11. The method of claim 8, wherein the plurality of sample resistance values of the load are obtained in response to a timer value associated with a timer of the controller being greater than a threshold timer value.

12. A system for enhancing resistance measurements of a load, the system comprising:
    one or more processors and one or more nontransitory computer-readable mediums comprising instructions that are executable by the one or more processors, wherein the instructions comprise:
    providing a calibration signal to the load;
    obtaining a plurality of sample resistance values of the load in response to providing the calibration signal;
    determining an average resistance value based on the plurality of sample resistance values;
    determining a resistance difference based on the average resistance value and a nominal resistance value associated with the load;
    updating an offset correction value in response to the resistance difference being greater than a resistance tolerance; and
    measuring a resistance of the load based on the offset correction value and one or more electrical characteristics of the load.

13. The system of claim 12, wherein the load is a heater comprising a resistive element.

14. The system of claim 12, wherein the instructions further comprise:
    obtaining a plurality of current values of the load;
    determining an average current value based on the plurality of current values; and
    determining the offset correction value based on a product of the average current value and the resistance difference.

15. The system of claim 12, wherein the instructions further comprise:
    obtaining a plurality of voltage values and a plurality of current values of the load;
    determining an average voltage value based on the plurality of voltage values and an average current value based on the plurality of current values;
    determining a nominal current value based on a quotient of the average voltage value and the nominal resistance value; and
    determining the offset correction value based on a difference between the nominal current value and the average current value.

16. A method for enhancing resistance measurements of a load, the method comprising:

providing a calibration signal to the load, wherein the calibration signal has a predetermined voltage value range defined by a first voltage value and a second voltage value;

determining a calibration mode of a controller based on the calibration signal, wherein the calibration mode is one of an offset calibration mode and a gain calibration mode; and in response to determining the calibration mode is the offset calibration mode:
  obtaining a plurality of sample resistance values of the load;
  determining an average resistance value based on the plurality of sample resistance values;
  determining a resistance difference based on the average resistance value and a nominal resistance value associated with the load;
  updating an offset correction value of the controller in response to the resistance difference being greater than a resistance tolerance; and
  measuring a resistance of the load based on the offset correction value and one or more electrical characteristics of the load.

17. The method of claim 16, wherein:
the calibration mode is the gain calibration mode when the calibration signal has the second voltage value;
the second voltage value is greater than the first voltage value; and
the first voltage value and the second voltage value are greater than zero volts.

18. The method of claim 16, wherein:
the calibration mode is the offset calibration mode when the calibration signal has the first voltage value;
the second voltage value is greater than the first voltage value; and
the first voltage value and the second voltage value are greater than zero volts.

19. The method of claim 16, wherein the calibration mode is the offset calibration mode in response to a timer value associated with a timer of the controller being greater than a threshold timer value.

20. The method of claim 16, wherein the offset correction value is a voltage offset correction value, a current offset correction value, or a combination thereof.

21. The method of claim 20 further comprising:
obtaining, in response to determining the calibration mode is the offset calibration mode, a plurality of current values of the load;
determining, in response to determining the calibration mode is the offset calibration mode, an average current value based on the plurality of current values; and
determining, in response to determining the calibration mode is the offset calibration mode, the offset correction value based on the average current value and the resistance difference, wherein the offset correction value is the voltage offset correction value.

22. The method of claim 21, wherein the offset correction value is further based on a product of the average current value and the resistance difference.

23. The method of claim 20 further comprising:
obtaining, in response to determining the calibration mode is the offset calibration mode a plurality of voltage values and a plurality of current values of the load;
determining, in response to determining the calibration mode is the offset calibration mode, an average voltage value based on the plurality of voltage values and an average current value based on the plurality of current values;
determining, in response to determining the calibration mode is the offset calibration mode, a nominal current value based on the average voltage value and the nominal resistance value; and
determining, in response to determining the calibration mode is the offset calibration mode, the offset correction value based on the nominal current value and the average current value, wherein the offset correction value is the current offset correction value.

24. The method of claim 23, wherein the nominal current value is further based on a quotient of the average voltage value and the nominal resistance value.

25. The method of claim 23, wherein the offset correction value is further based on a difference between the nominal current value and the average current value.

26. A system for enhancing resistance measurements of a load, the system comprising:
one or more processors and one or more nontransitory computer-readable mediums comprising instructions that are executable by the one or more processors, wherein the instructions comprise:
  providing a calibration signal to the load, wherein the calibration signal has a predetermined voltage value range defined by a first voltage value and a second voltage value, and wherein the second voltage value is greater than the first voltage value;
  determining a calibration mode of a controller based on the calibration signal, wherein the calibration mode is an offset calibration mode when the calibration signal has the first voltage value, and wherein the calibration mode is a gain calibration mode when the calibration signal has the second voltage value; and
  in response to determining the calibration mode is the offset calibration mode:
    obtaining a plurality of sample resistance values of the load;
    determining an average resistance value based on the plurality of sample resistance values;
    determining a resistance difference based on the average resistance value and a nominal resistance value associated with the load;
    updating an offset correction value in response to the resistance difference being greater than a resistance tolerance; and
    measuring a resistance of the load based on the offset correction value and one or more electrical characteristics of the load.

27. The system of claim 26, wherein the calibration mode is the offset calibration mode in response to a timer value associated with a timer of the controller being greater than a threshold timer value.

28. The system of claim 26, wherein the instructions further comprise:
obtaining, in response to determining the calibration mode is the offset calibration mode, a plurality of current values of the load;
determining, in response to determining the calibration mode is the offset calibration mode, an average current value based on the plurality of current values; and
determining, in response to determining the calibration mode is the offset calibration mode, the offset correction value based on a product of the average current value and the resistance difference.

29. The system of claim 26, wherein the instructions further comprise:
- obtaining, in response to determining the calibration mode is the offset calibration mode a plurality of voltage values and a plurality of current values of the load;
- determining, in response to determining the calibration mode is the offset calibration mode, an average voltage value based on the plurality of voltage values and an average current value based on the plurality of current values;
- determining, in response to determining the calibration mode is the offset calibration mode, a nominal current value based on a quotient of the average voltage value and the nominal resistance value; and
- determining, in response to determining the calibration mode is the offset calibration mode, the offset correction value based on a difference between the nominal current value and the average current value.

30. The system of claim 26, wherein the load is a heater comprising a resistive element.

* * * * *